(12) United States Patent
Lee et al.

(10) Patent No.: US 7,387,130 B2
(45) Date of Patent: Jun. 17, 2008

(54) CLEANING SOLUTIONS INCLUDING NUCLEOPHILIC AMINE COMPOUND HAVING REDUCTION AND OXIDATION POTENTIALS

(75) Inventors: Wai Mun Lee, Fremont, CA (US); Charles U. Pittman, Jr., Starkville, MS (US); Robert J. Small, Satsuma, AL (US)

(73) Assignee: EKC Technology, Inc., Hayward, CA (US)

(*) Notice: Subject to any disclaimer, the term of this patent is extended or adjusted under 35 U.S.C. 154(b) by 0 days.

(21) Appl. No.: 11/633,459

(22) Filed: Dec. 5, 2006

(65) Prior Publication Data

US 2007/0078074 A1  Apr. 5, 2007

Related U.S. Application Data

(63) Continuation of application No. 11/181,747, filed on Jul. 15, 2005, now Pat. No. 7,144,849, which is a continuation of application No. 10/826,286, filed on Apr. 19, 2004, now Pat. No. 7,051,742, which is a continuation of application No. 09/988,545, filed on Nov. 20, 2001, now abandoned, which is a continuation of application No. 09/603,693, filed on Jun. 26, 2000, now Pat. No. 6,319,885, which is a continuation of application No. 08/654,007, filed on May 28, 1996, now Pat. No. 6,110,881, which is a continuation of application No. 08/078,657, filed on Jun. 21, 1993, now abandoned.

(51) Int. Cl.
*B08B 3/04* (2006.01)
*C11D 3/26* (2006.01)
*C11D 3/30* (2006.01)
*C11D 3/43* (2006.01)

(52) U.S. Cl. .................. 134/1.3; 134/1.2; 134/39; 134/40; 134/41; 510/176; 510/477; 510/488; 510/499

(58) Field of Classification Search .............. None
See application file for complete search history.

(56) References Cited

U.S. PATENT DOCUMENTS 3,160,539 A   12/1964   Hall et al.

(Continued)

FOREIGN PATENT DOCUMENTS

EP   0299166   1/1989

(Continued)

OTHER PUBLICATIONS

World Patent Index 87-077755 re: SU-A-1244211, 1994.

(Continued)

*Primary Examiner*—Gregory R. Del Cotto
(74) *Attorney, Agent, or Firm*—Morgan Lewis & Bockius LLP

(57) ABSTRACT

A composition for removing resists and etching residue from substrates containing at least one nucleophilic amine compound having oxidation and reduction potentials, at least one organic solvent, water and, optionally, a chelating agent is described. The chelating agent is preferred to be included since it provides added stability and activity to the cleaning composition so that the composition has long term effectiveness. If a chelating agent is not present, the composition, while providing for adequate stripping and cleaning upon initial use of the composition following mixing, has only short term stability. In this latter instance, the nucleophilic amine compound and organic solvent components of the composition preferably are maintained separate from each other until it is desired to use the composition. Thereafter, the components are combined.

11 Claims, 10 Drawing Sheets

U.S. PATENT DOCUMENTS

| | | | |
|---|---|---|---|
| 3,530,186 A | 9/1970 | Greco | |
| 3,582,401 A | 6/1971 | Berilla et al. | |
| 3,619,390 A | 11/1971 | Dillenberg | |
| 3,649,395 A | 3/1972 | Lee | |
| 3,753,933 A | 8/1973 | Olstowski et al. | |
| 3,972,839 A | 8/1976 | Murphy | |
| 4,067,690 A | 1/1978 | Cuisia et al. | |
| 4,078,102 A | 3/1978 | Bendz et al. | |
| 4,105,576 A | 8/1978 | Seidenberger | |
| 4,111,767 A | 9/1978 | Kawagishi et al. | |
| 4,155,866 A | 5/1979 | Berkenblit et al. | |
| 4,165,294 A | 8/1979 | Vander Mey | |
| 4,170,478 A | 10/1979 | Case et al. | |
| 4,187,140 A | 2/1980 | Berkenblit et al. | |
| 4,221,674 A | 9/1980 | Vander Mey | |
| 4,238,275 A | 12/1980 | Shih | |
| 4,239,661 A | 12/1980 | Muraoka et al. | |
| 4,242,218 A | 12/1980 | Vander Mey | |
| 4,264,716 A | 4/1981 | Vincent et al. | |
| 4,268,406 A | 5/1981 | O'Brien et al. | |
| 4,276,185 A | 6/1981 | Martin | |
| 4,276,186 A | 6/1981 | Bakos et al. | |
| 4,278,635 A | 7/1981 | Kerst | |
| 4,279,870 A | 7/1981 | Natansohn et al. | |
| RE30,714 E | 8/1981 | Harriman et al. | |
| 4,282,111 A | 8/1981 | Ciuba | |
| 4,284,435 A | 8/1981 | Fox | |
| 4,289,645 A | 9/1981 | Muccitelli | |
| RE30,796 E | 11/1981 | Lesinski | |
| 4,350,606 A | 9/1982 | Cuisia et al. | |
| 4,363,741 A | 12/1982 | Gould | |
| 4,395,348 A | 7/1983 | Lee | |
| 4,395,479 A | 7/1983 | Ward et al. | |
| 4,401,747 A | 8/1983 | Ward, Jr. et al. | |
| 4,403,029 A | 9/1983 | Ward, Jr. et al. | |
| 4,428,871 A | 1/1984 | Ward et al. | |
| 4,482,626 A | 11/1984 | Twist et al. | |
| 4,509,989 A | 4/1985 | Sumansky | |
| 4,539,230 A | 9/1985 | Shimizu et al. | |
| 4,549,968 A | 10/1985 | Muccitelli | |
| 4,554,049 A | 11/1985 | Bastenbeck | |
| 4,617,251 A | 10/1986 | Sizenski | |
| 4,626,411 A | 12/1986 | Nemes et al. | |
| 4,699,868 A | 10/1987 | Sabongi | |
| 4,732,797 A | 3/1988 | Johnson et al. | |
| 4,732,887 A | 3/1988 | Obanawa et al. | |
| 4,737,195 A | 4/1988 | Carandang et al. | |
| 4,744,834 A | 5/1988 | Haq | |
| 4,765,844 A | 8/1988 | Merrem et al. | |
| 4,769,084 A | 9/1988 | Gubela | |
| 4,770,713 A | 9/1988 | Ward | |
| 4,786,578 A | 11/1988 | Neisius et al. | |
| 4,824,763 A | 4/1989 | Lee | |
| 4,824,949 A | 4/1989 | Lachhein et al. | |
| 4,834,912 A | 5/1989 | Hodgens et al. | |
| 4,861,386 A | 8/1989 | Hoy | |
| 4,873,136 A | 10/1989 | Foust et al. | |
| 4,895,703 A | 1/1990 | Zupanovich et al. | |
| 4,929,301 A | 5/1990 | Beechko | |
| 4,941,941 A | 7/1990 | Austin et al. | |
| 4,980,077 A | 12/1990 | Morris et al. | |
| 5,015,298 A | 5/1991 | Arrington | |
| 5,022,926 A | 6/1991 | Kreh et al. | |
| 5,043,252 A | 8/1991 | Akiyama et al. | |
| 5,049,201 A | 9/1991 | Cheng et al. | |
| 5,073,622 A | 12/1991 | Wojtech et al. | |
| 5,091,103 A | 2/1992 | Dean et al. | |
| 5,091,108 A | 2/1992 | Harder et al. | |
| 5,094,814 A | 3/1992 | Soderquist et al. | |
| 5,141,803 A | 8/1992 | Pregozen | |
| 5,143,592 A | 9/1992 | Toro | |
| 5,185,235 A | 2/1993 | Sato et al. | |
| 5,279,771 A | 1/1994 | Lee | |
| 5,288,332 A | 2/1994 | Pastilnik et al. | |
| 5,290,361 A | 3/1994 | Hayashida et al. | |
| 5,308,745 A | 5/1994 | Schwartzkopf | |
| 5,334,332 A | 8/1994 | Lee | |
| 5,342,543 A | 8/1994 | Morris et al. | |
| 5,374,454 A | 12/1994 | Bickford et al. | |
| 5,381,807 A | 1/1995 | Lee | |
| 5,399,464 A | 3/1995 | Lee | |
| 5,407,788 A | 4/1995 | Fang | |
| 5,419,779 A | 5/1995 | Ward | |
| 5,482,566 A | 1/1996 | Lee | |
| 5,562,963 A | 10/1996 | Davis | |
| 5,683,813 A | 11/1997 | Davis | |
| 5,746,837 A | 5/1998 | Beck et al. | |
| 5,792,274 A | 8/1998 | Tanabe et al. | |
| 5,795,702 A | 8/1998 | Tanabe et al. | |
| 5,798,323 A | 8/1998 | Honda et al. | |
| 5,911,835 A | 6/1999 | Lee et al. | |
| 5,968,848 A | 10/1999 | Tanabe et al. | |
| 6,068,000 A | 5/2000 | Tanabe et al. | |
| 6,110,881 A | 8/2000 | Lee et al. | |
| 6,187,730 B1 | 2/2001 | Lee | |
| 6,225,034 B1 | 5/2001 | Tanabe et al. | |
| 6,291,142 B1 | 9/2001 | Tanabe et al. | |
| 6,399,551 B1 | 6/2002 | Lee | |
| 6,564,812 B2 | 5/2003 | Lee | |

FOREIGN PATENT DOCUMENTS

| | | |
|---|---|---|
| EP | 0300463 | 1/1989 |
| EP | 0301756 | 2/1989 |
| EP | 0336400 | 10/1989 |
| EP | 0485161 | 5/1992 |
| EP | 485161 | 5/1992 |
| EP | 578507 | 1/1994 |
| GB | 1144481 | 3/1969 |
| GB | 2157670 | 10/1985 |
| JP | 55-52379 | 4/1980 |
| JP | 56-5899 | 1/1981 |
| JP | 62-49355 | 3/1987 |
| JP | 62-95531 | 5/1987 |
| JP | 63-183445 | 7/1988 |
| JP | 64-21088 | 1/1989 |
| JP | 1-105949 | 4/1989 |
| JP | 1-159388 | 6/1989 |
| JP | 545894 | 9/1993 |
| JP | 5-259066 | 10/1993 |
| SU | 1244211 | 7/1986 |

OTHER PUBLICATIONS

Material Safety Data Sheet—3 pages, 1996.

Material Safety Data Sheet, Experimental Stripper, WMX-225 (1 sheet), 1996.

Material Safety Data Sheet, Experimental Stripper, WMX-230 (1 sheet),1996.

"Reactions of Catechol," Crown Zellerbach Corp., Chemicals Products Division, Camas, Washinton 98607 (pp. 1-33 w/Cover Sheet and Table of Contents), 1996.

ously used for such or similar purposes containing one or more of the following solvents: halogenated hydrocarbons such as, for example, methylene chloride or tetrachloroethylene; amines and their derivatives such as, for example, dimethylformamide, dimethylacetamide, pyrrolidone, diethanolamine, and triethanolamine; glycol ethers, such as, for example, ethylene glycol monoethyl ether, 2-butoxyethanol, and 2-(butoxy-ethoxy)ethanol; and an alkylsulfone, such as, for example, dimethylsulfone.

CLEANING SOLUTIONS INCLUDING NUCLEOPHILIC AMINE COMPOUND HAVING REDUCTION AND OXIDATION POTENTIALS

RELATED APPLICATIONS

The present invention application is a continuation of U.S. patent application Ser. No. 11/181,747, filed Jul. 15, 2005, (issued as U.S. Pat. No. 7,144,849 on Dec. 5, 2006), which is a continuation of Ser. No.10/826,286, filed Apr. 19, 2004, (issued as U.S. Pat. No. 7,051,742 on May 30, 2006), which is a continuation of U.S. patent application Ser. No. 09/988,545, filed Nov. 20, 2001, abandoned, which is a continuation of U.S. patent application Ser. No. 09/603,693, filed June 26, 2000, which issued as U.S. Pat. No. 6,319,885 on Nov. 20, 2001, which is a continuation of U.S. patent application Ser. No. 08/654,007, filed May 28, 1996, which issued as U.S. Pat. No. 6,110,881 on Aug. 29, 2000, which is a continuation of U.S. patent application Ser. No. 08/078,657, filed Jun. 21, 1993, now abandoned.

FIELD OF THE INVENTION

The present invention is directed to resist and etching residue removing compositions comprising at least one nucleophilic amine compound which possesses reduction and oxidation potentials, at least one organic solvent which is miscible with the nucleophilic amine, water and, optionally, one or more chelating agents. The solutions are useful in removing resists and etching residue from micro-circuitry during fabrication processes.

BACKGROUND OF THE INVENTION

During the fabrication of microcircuits, the precise positioning of a number of appropriately doped regions on a slice of semiconductor is required followed by the positioning of one or more interconnection patterns on the semiconductor. Positive-type resists have been extensively used as masking materials to delineate patterns onto a substrate so that the patterns can be subsequently etched or otherwise defined into the substrate. The final steps in preparing the substrate then involve removing the unexposed resist material and any etching residue from the substrate. Increasingly, however, plasma etching, reactive ion etching or ion milling is used to define the pattern in a substrate which renders the resist mask substantially impossible to remove by stripping agents heretofore commonly used for such or similar purposes containing one or more of the following solvents: halogenated hydrocarbons such as, for example, methylene chloride or tetrachloroethylene; amines and their derivatives such as, for example, dimethylformamide, dimethylacetamide, pyrrolidone, diethanolamine, and triethanolamine; glycol ethers, such as, for example, ethylene glycol monoethyl ether, 2-butoxyethanol, and 2-(butoxy-ethoxy)ethanol; and an alkylsulfone, such as, for example, dimethylsulfone.

Additionally, during such etching processing, an organometallic by-product compound can be formed on the sidewall of the substrate material. The above-mentioned solvents are also ineffective in removing such organometallic polymers. A recently developed technique effective for photoresist removal is plasma oxidation, also known as plasma ashing. However, while this process is effective for removing a photoresist, it is not effective for removing the organometallic polymer formed on the sidewall of the substrate during the etching process.

Further, polyimides are increasingly used in microelectronics as fabrication aids, passivants, and inter-level insulators. The use of a polyimide as a fabrication aid includes application of the polyimide as a photoresist, planarization layer in a multi-level photoresist scheme and as an ion implant mask. In these applications, the polymer is applied to a wafer or substrate, subsequently cured or patterned by a suitable method and removed after use. Many conventional strippers are not sufficiently effective in removing the polyimide layer once the polyimide has been subjected to a severe curing operation. The removal of such polyimides is normally accomplished by boiling the substrate in hydrazine or in oxygen plasma.

Accordingly, a composition suitable for stripping a resist so as to remove the resist rapidly and completely would provide substantial advantages over conventional strippers. Further, a composition capable of removing both the resist and organometallic by-products would provide even a greater advantage. As apparent, if an etching residue is not completely removed from the substrate, the residue can interfere with subsequent processes involving the substrate.

In addition to removing completely the resist material, particularly with the introduction of submicron process techniques to form wafers, there is a demand for cleaning technology for removing etching residue remaining following resist removal. The requirement for a cleaning solution to remove all types of residue generated as a result of plasma etching of various types of metals, such as aluminum, aluminum/silicon/copper, titanium, titanium nitride, titanium/tungsten, tungsten, silicon oxide, polysilicon crystal, etc., presents a need for more effective cleaning chemistry in the processing area.

More specifically, during the fabrication of microcircuits, the substrate surface can be aluminum, titanium, silicon oxide or polysilicon and patterns are delineated thereon by chemical etching. Increasingly, plasma etching, reactive ion etching or ion milling are used, and such etching processes produce undesirable by-products from the interaction of the plasma gases, reacted species and the photoresist. The composition of such by-products is generally made up of the etched substrates, underlying substrate, photoresist and etching gases. The formation of such by-products is influenced by the type of etching equipment, process conditions and substrates utilized. These by-products are generally referred to as "sidewall polymer," "veil", "picket fences", "rabbit ears" or "goat horns", and cannot be removed completely by either oxygen plasma or conventional solvents, such as N-methyl-2-pyrrolidone, diethyleneglycolmonobutyl-ether, dimethylacetamide or the like, which are conventionally used to remove resists. It is critical that all of the etching residue and the like be removed to provide a wafer having sufficient integrity for subsequent use of the wafer in microcircuitry.

Examples of alkaline/solvent mixtures useful as photoresist strippers, but not necessarily cleaners, known for use in stripping applications include dimethylacetamide or dimethylformamide and alkanolamines as described in U.S. Pat. Nos. 4,770,713 and 4,403,029; 2-pyrrolidone, dialkylsulfone and alkanolamines as described in U.S. Pat. Nos. 4,428,871, 4,401,747, and 4,395,479; and 2-pyrrolidone and tetramethylammonium hydroxide as described in U.S. Pat. No. 4,744,834. Such stripping compositions, however, have only proven successful in cleaning "sidewall polymer" from the contact openings and metal line etching in simple micro-circuit manufacturing involving a single layer of metal when the metal structure involves mainly Al—Si or Al—Si—Cu and the "sidewall polymer" residue contains only an organometallic compound with aluminum. The cleaning mechanism involving such materials has been studied by EKC Technology, Inc. and Intel Corp., as presented at the K.T.I. Conference in 1989 in the presentation entitled "*Metal Corrosion in Wet Resist Stripping Process,*" by P. L. Pai, C. H. Ting, W. M. Lee and R. Kuroda. Due to the corrosive nature of such strippers as above described, the "sidewall polymer" is removed either by attacking the organoaluminum compound or the metal surface itself and causing the "sidewall polymer" residue to be lifted off. Further, in addition to the use of the stripping composition, mechanical scrubbing, such as ultrasonic vibration, is required to achieve complete removal of the "sidewall polymer."

The most current submicron processing techniques utilized in the industry involving multi-levels of metal and multi-level of interconnecting processes usually incorporate metal materials including TiN, TiW, Ti, TiSi, W, WSi and the like. The use of such materials results in the generation of new organometallic material by-products during plasma etching, whether formed intentionally or unintentionally, which renders the cleaning incomplete when utilizing existing commercially available stripping and cleaning products. Such findings were described at the SPIE Symposium on Microlithography in 1991 in a presentation entitled "*Plasma Etching and Reactive Ion Etching*" by John W. Coburn. In particular, it has been found that the residue remaining on the substrate surface after removal of a resist by plasma ashing has changed from the organometallic to the corresponding oxide, such as $TiO_2$, which is chemically inert to mild alkaline strippers. The effect of such poor cleaning results in low device yield, low device reliability, and low device performance.

Therefore, conventional stripping compositions are ineffective in removing sidewall organometallic and other metal oxide residue which is present following use of the current technology to remove resists. Even plasma ashing, which has been found effective for removing photoresists, is not effective for removing the sidewall organometallic polymer and some other of the metal oxide residues formed during etching processes.

OBJECTS OF THE INVENTION

Accordingly, a primary object of the present invention is to provide a resist and etching residue removing composition comprising at least one nucleophilic amine compound which possesses oxidation and reduction potentials, at least one solvent which is miscible with the nucleophilic amine compound; water, and optionally, one or more chelating agents; and a method of using the composition to completely remove a resist and clean a microcircuitry substrate.

A further primary object of the present invention is to provide a resist and etching residue removing composition having long term stability by providing a composition comprising at least one nucleophilic amine compound possessing reduction and oxidation potentials, at least one solvent which is miscible with the nucleophilic amine compound, water, and at least one chelating agent.

A further primary object of the present invention is to provide a resist and etching residue removing composition including at least one nucleophilic amine compound possessing reduction and oxidation potentials, at least one solvent which is miscible with the nucleophilic amine compound, and water, wherein the nucleophilic amine and the organic solvent are maintained separately and combined just prior to use and which is disposable after use due to having a short active life cycle. Alternatively, this composition, once formed by combining the components as identified above, can be reactivated by combining a chelating agent therewith.

A further primary object of the present invention is to provide a composition for removing residue formed during etching and resist removal processes from a substrate without adversely damaging the substrate surface or hindering subsequent operation or process steps involving the substrate following use of the composition, the non-used portion of the composition can be disposed of or be reactivated by the addition of a chelating agent.

BRIEF DESCRIPTION OF THE INVENTION

The present invention is directed to a resist and etching residue removing composition comprising at least one nucleophilic amine compound having oxidation and reduction potentials, at least one organic solvent which is miscible with the nucleophilic amine compound, water and, optionally, one or more chelating agents. The water can be added to the composition by itself or as a carrier for the nucleophilic amine compound, i.e., the nucleophilic amine is present in aqueous solution.

Related application U.S. Ser. No. 610,044 filed Nov. 5, 1990, which is incorporated herein by reference and which corresponds to published European Patent Application No. 485,161 A1, discloses hydroxylamine in combination with an alkanolamine which is miscible with the hydroxylamine as being useful to remove a resist from a substrate. It has now been found that compounds other than hydroxylamine and an alkanolamine are useful for removing resists, but in particular are also useful in removing etching residues from substrates. It has been found that nucleophilic amine compounds having oxidation and reduction potentials satisfactorily remove resists and etching residue from a substrate when combined with an organic solvent which is miscible with the nucleophilic amine compound and water. While the nucleophilic amine compound must have the potential for reduction and oxidation, it is not required that reduction and oxidation actually occur in the use of the composition. Examples of nucleophilic amine compounds useful in the present invention include hydroxylamines, hydrazines, certain specified anines, and their derivatives as further described below. The organic solvent is not required to be an amine, but the presence of an amine solvent is preferred.

Further, it has been found that when a chelating agent is present in an aqueous solution containing at least one nucleophilic amine compound having reduction and oxidation potentials and an organic solvent which is miscible with the nucleophilic amine compound that at least two additional surprising benefits are achieved, namely, (1) the chelating agent assists in cleaning by retaining etching residue in the cleaning solution and thereby avoiding resettling of the residue onto the substrate and (2) the chelating agent serves as a stabilizing agent to provide long term effectiveness to the composition. More specifically, the chelating agent enhances the cleaning capability of the composition by retaining or "freezing" the etching residue in the cleaning solution after the nucleophilic amine compound has picked up the residue from the substrate. This action minimizes resettling of any residue onto the substrate. The presence of the chelating agent further provides the composition with long term activity and, therefore, a long shelf life. When a chelating agent is not present in the aqueous solution of a nucleophilic amine compound and organic solvent, the solution has only short term stability, i.e., generally an active life of about one week. Accordingly, when a chelating agent is not present, it is preferable to maintain the nucleophilic amine compound and organic solvent separately until just prior to use. After the components are combined and the solution used, the remaining solution can be disposed of or, once the activity has decreased, the solution can be reactivated by the addition of a chelating agent. Preferred chelating agents are dihydroxybenzenes and their derivatives as further described below.

The cleaning composition is especially useful in removing etching residue from substrates which contain metal elements other than aluminum such as titanium (Ti), tungsten (W), silicon (Si) and silicon oxide ($SiO_2$). While the compositions of the invention are capable of removing resists from substrates, the compositions of the invention have been shown to have a surprising capacity for cleanly removing etching residue, in particular organometallic and metal oxide etching residue, from a substrate surface following removal of a resist therefrom. Currently in the industry, etching residue is extremely difficult to completely remove without damaging the substrate.

The cleaning compositions of the present invention are particularly suitable for removing organometallic and metal oxide residues from a substrate, in particular, during the fabrication of a submicron (i.e., less than 0.8 microns) integrated circuit without adversely affecting or hindering subsequent manufacturing operation or process steps involving the substrate. Further, the cleaning compositions of the invention are effective in removing organometallic residue outgasing which has been deposited on parts of the etching equipment utilized in the processing. This equipment can be made of polycarbonate, ceramic or aluminum.

The method of removing a resist or etching residue from a substrate using the compositions of the present invention also is advantageous in that complex process steps and equipment are not required. The method of the invention involves contacting a substrate containing a resist or etching residue with the composition of the invention as described herein at a temperature and for a time sufficient to remove the particular resist or etching residue present.

DESCRIPTION OF THE DRAWING

As shown in FIGS. 7A and 7B, all the organometallic residue was removed using the composition of the present invention while, as evident from FIGS. 7C and 7D, residue remained on the substrate treated with the stripper.

DESCRIPTION OF THE PRESENTLY PREFERRED EMBODIMENT

Figure 1:
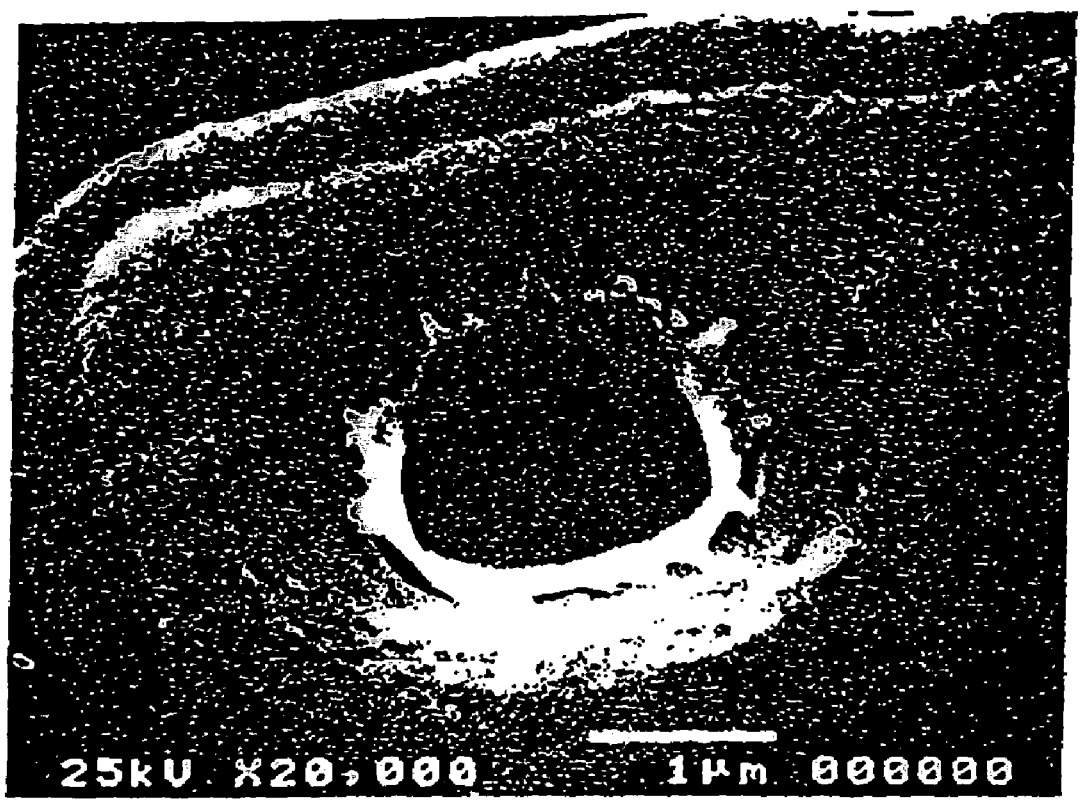
FIG. 1 shows etched wafer residue following the use of plasma ashing to remove a resist from a silicon oxide dielectric layer which had been earlier plasma etched.

The cleaning and stripping composition of the present invention for removing etching residue and resists from a substrate contains at least one nucleophilic amine compound having oxidation and reduction potentials in a cleaning environment, at least one organic solvent which is miscible with the nucleophilic amine compound, water, and, optionally, one or more chelating agents. The water can be provided in the composition independently or in combination with the nucleophilic amine compound, for example the nucleophilic amine compound can be added as a 50% aqueous solution.

In a composition according to the invention, the composition preferably contains a chelating agent. The chelating agent serves to provide long term stability and activity to the composition. The composition, therefore, has the desirable commercial attribute of having a long shelf life.

Alternatively, the composition can be provided including at least one nucleophilic amine compound having reduction and oxidation potentials, an organic solvent and water. This composition, however, only has short term effectiveness and so it is preferable that the nucleophilic amine compound and organic solvent are maintained separate until just prior to use. As stated above, the water can be present in combination with the nucleophilic amine compound. In this case the nucleophilic amine compound in aqueous solution will be maintained separate from the organic solvent until just prior to use. The components are then combined and the composition used as needed. Generally, the composition without a chelating agent will have an effective active life for approximately one week. Any unused portion of the composition can then be simply disposed of or, alternatively, the unused portion can be reactivated by the addition of a chelating agent to the solution.

The composition of the invention can be used as a stripping composition to remove a resist or a cleaning composition to remove etching residue from a substrate. The ability to remove etching residue effectively is in particular surprising in view of the difficulty experienced in the art to produce an effective etching residue removing solution.

The cleaning compositions of the present invention are suitable for removing etching residue, such as organometallic and metal oxide residue, formed on a substrate, in particular residue formed during plasma etching processes. The substrate can include aluminum and non-aluminum metal elements such as titanium, tungsten, silicon and silicon oxide. The extent and type of residue remaining following etching is determined by the etching equipment utilized, process conditions and substrates utilized.

The cleaning composition preferably includes from about 5% to 50% by weight of at least one nucleophilic amine compound having reduction and oxidation potentials, from about 10% to 80% by weight of at least one organic solvent which is miscible with the nucleophilic amine compound, optionally from about 5%-30% by weight of at least one chelating agent, and with the remaining balance of the composition being made up of water, preferably high purity deionized water.

Compounds suitable for use as the nucleophilic amine compound having oxidation and reduction potentials include certain amines, hydroxylamines, hydrazines and their derivatives as set forth below. The nucleophilic amine compound used in the present invention does not have to actually take part in oxidation or reduction during a cleaning or stripping process. The nucleophilic amine compound must only possess oxidation and reduction qualities in a cleaning or stripping environment. Suitable nucleophilic amine compounds useful in the present invention are compounds having the following formula:

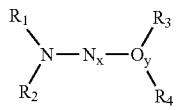

wherein $R_1$, $R_2$, $R_3$ and $R_4$ are either the same or different and selected from the group including hydrogen; a hydroxyl group; a substituted $C_1$-$C_6$ straight, branched or cyclo alkyl, alkenyl or alkynl group; a substituted acyl group; a straight or branched alkoxy group; an amidyl group; a carboxyl group; an alkoxyalkyl group; an alkylamino group; an alkyl sulfonyl group; or a sulfonic acid group; x=0 when y=1 or x=0 or 1 when y=0; y=0 when x=1 or y=0 or 1 when x=0; provided $R_4$ is present only when x=1; or salts thereof. Specific examples of nucleophilic amine compounds are further described below.

Hydroxylamines suitable for use as the nucleophilic amine compound having reduction and oxidation potentials are represented by the following formula:

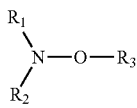

wherein $R_1$, $R_2$, and $R_3$ are independently hydrogen; a hydroxyl group; optionally a substituted $C_1$-$C_6$ straight, branched or cyclo alkyl, alkenyl, or alkynyl group; optionally a substituted acyl group, straight or branched alkoxy group, amidyl group, carboxyl group, alkoxyalkyl group, alkylamino group, alkylsulfonyl group, or sulfonic acid group, or the salt of such compounds. Derivatives of these compounds, for example the amides of the above described, are also suitable for use.

Amines suitable for use as the nucleophilic amine compound of the invention can be represented by the following formula:

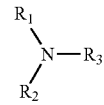

wherein $R_1$, $R_2$, and $R_3$ are independently hydrogen; optionally a substituted $C_1$-$C_6$ straight, branched or cyclo alkyl, alkenyl, or alkynyl group; optionally a substituted acyl group, straight or branched alkoxy group, amidyl group, carboxyl group, alkoxyalkyl group, alkylamino group, or alkylsulfonyl group, sulfonic acid group; or the salt of such compounds.

Hydrazines suitable for use as the nucleophilic amine compound of the present invention can be represented by the following formula:

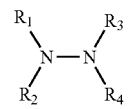

wherein $R_1$, $R_2$, $R_3$, and $R_4$ are independently hydrogen; a hydroxyl group; optionally a substituted $C_1$-$C_6$ straight, branched or cyclo alkyl, alkenyl, or alkynyl group; optionally a substituted acyl group, straight or branched alkoxy group, amidyl group, carboxyl group, alkoxyalkyl group, alkylamino group, alkylsulfonyl group, or sulfonic acid group: or the salts of such compounds.

The preferred nucleophilic amine compounds having reduction and oxidation potentials are alkoxy substituted amines, hydroxylamine, alkyl or carboxyl substituted hydroxylamine, and alkyl or carboxyl substituted hydrazine. The most preferred compounds are hydroxylamine, N-methylhydroxylamine hydrochloride, N,N-diethylhydroxylamine, and methylhydrazine.

Organic solvents suitable for use in the present invention are miscible with the nucleophilic amine compound and are preferably water-soluble. Additionally, the organic solvent useful in the present invention preferably has a relatively high boiling point, such as for example 100° C. or above, and a high flash point, such as for example 45° C. or above.

Suitable organic solvents include alkanolamines and their derivatives. Additionally, non-amine solvents, such as dimethyl sulfoxide (DMSO), are suitable for use. Preferably an amine solvent is present alone or in combination with another solvent. Previously, it had been believed that an alkanolamine solvent had to be utilized. While an alkanolamine solvent is still a preferred solvent, it has now been found that other solvents are suitable for use when utilized with at least one nucleophilic amine compound having reduction and oxidation potentials.

Suitable alkanolamines are primary, secondary or tertiary amines and are preferably monoamines, diamines or triamines, and, most preferably, monoamines. The alkanol group of the amines preferably has from 1 to 5 carbon atoms.

Preferred alkanolamines suitable for use in the present invention can be represented by the chemical formula $R_1R_2$—N—$CH_2CH_2$—O—$R_3$ wherein $R_1$ and $R_2$ can be H, $CH_3$, $CH_3CH_2$, or $CH_2CH_2OH$ and $R_3$ is $CH_2CH_2OH$.

Examples of suitable alkanolamines include monoethanolamine, diethanolamine, triethanolamine, tertiarybutyldiethanolamine isopropanolamine, 2-amino-1-propanol, 3-amino-1-propanol, isobutanolamine, 2-amino-2-ethoxypropanol, and 2-amino-2-ethoxy-ethanol, which is also known as diglycolamine.

Additional examples of organic solvents suitable for use in the composition of the present invention include N-methyl-2-pyrrolidinone, N,N-dimethylpropanamide, N,N-diethylformamide, ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine, and ethylenetriamine. Additional polar solvents as known in the art can also be used in the composition of the present invention.

Preferred chelating agents useful in the composition of the invention are hydroxybenzenes according to the formula—

wherein n=1-4, m=2-5 and R is independently hydrogen, optionally a substituted $C_1$-$C_6$ straight, branched or cyclo alkyl, alkenyl, or alkynyl group; optionally a substituted acyl group, straight or branched alkoxy group, amidyl group, carboxyl group, alkoxyalkyl group, aklylamino group, alkylsulfonyl group, or sulfonic acid group; or the salt of such compounds. The preferred compounds are the dihydroxybenzene isomers, and the alkyl substituted dihydroxybenzenes. The most preferred compounds are 1,2-dihydroxybenzene and 1,2-dihydroxy-4-t-butylbenzene.

Additional chelating agents as known in the art can also be used in the composition of the present invention. For example, chelating agents which are metal ion free chelating agents can be utilized, such as thiophenol and its derivative according to the formula—

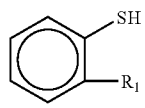

where $R_1$=OH or COOH; or ethylene diamine tetracarboxylic acid, of the formula—

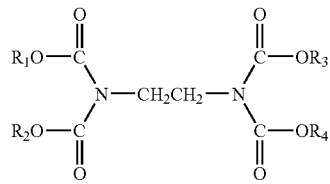

wherein $R_1$, $R_2$, $R_3$ and $R_4$ can be either H or $NH_4$, and its ammonium salt. Sodium, potassium or the like salts are not believed to be suitable for use based upon the understood mechanism of ionic contamination in a microcircuit as caused by cleaning. As evident from the above formula, the carboxylic acid can be mono-, di- or tri-substituted rather than tetra-substituted.

Additional suitable chelating agents include alkyl ammonium hydroxides which can be represented by the formula $R_1R_2R_3R_4NOH$ wherein $R_1$, $R_2$, $R_3$, and $R_4$ are short chain alkyl groups, preferably having from 1 to 5 carbon atoms, and wherein $R_1$, $R_2$, $R_3$, and $R_4$ can be the same or different. A preferred alkyl ammonium hydroxide is tetramethylammonium hydroxide.

A presently most preferred cleaning composition of the invention comprises, based on the total weight of the composition, 35 parts hydroxylamine, 65 parts 2-amino-2-ethoxyethanol, and 5 parts 1,2-dihydroxybenzene, wherein the hydroxylamine is present as a 50% aqueous solution. Other preferred specific embodiments are set forth in the examples below.

Examples of substrates from which the stripping and cleaning compositions of the present invention remove photoresists without attacking the substrates themselves include metal substrates such as aluminum, titanium/tungsten, aluminum/silicon, aluminum/silicon/copper; and substrates such as silicon oxide, silicon nitride, and gallium/arsenide; and plastic substrates such as polycarbonate.

The cleaning compositions of the present invention are also effective in removing etching residue from etching equipment utilized in etching substrates. Examples of commercially available etching equipment include Lam Research, Tegal, Electrotech, Applied Material, Tokyo Electron, Hitachi and the like.

The method of removing a resist from a substrate or cleaning etching residue from a substrate using the compositions of the present invention involves contacting a substrate having a material to be removed with a composition of the present invention for a time and at a temperature sufficient to remove the residue. The substrate is immersed in the composition. The time and temperature of immersion are determined based on the particular material being removed from a substrate. Generally, the temperature is in the range of from about ambient or room temperature to 100° C. and the contact time is from about 2 to 60 minutes. A preferred method involves immersing a substrate sample, such as a wafer in the solution of the invention for 30 minutes at a temperature of about 65° C. followed by placement of the substrate sample in a solvent bath for 10 minutes at about 80°-85° C. and, thereafter, rinsing the substrate sample in a water bath.

Examples illustrating the removal of etching residue from a substrate are set forth below. The following examples are provided to further illustrate the present invention and are not intended to limit the scope of the present invention.

In the examples, the substrate is treated in conventional known manners prior to the treatment of the substrate with the compositions of the present invention.

Examples of cleaning compositions according to the present invention utilized in Examples 1-15 below for removing etching residue from a substrate are set forth in Table I below.

TABLE I

| Cleaning Composition | Hydroxylamine Wt. % | Organic Solvent Wt. % |
|---|---|---|
| A | 25% | 50% 2-Amino-2-Ethoxy Ethanol |
| B | 20% | 60% 2-Amino-2-Ethoxy Ethanol |
| C | 20% | 55% 2-Amino-2-Ethoxy Ethanol |
| D | 17.5% | 50% Monoethanolamine |
| E | 8.75% | 30% 2-Amino-2-Ethoxy Ethanol |
| F | 15% | 60% Monoethanolamine |
| G | 15% | 70% 2-Amino-2-Ethoxy Ethanol |

TABLE I-continued

| Cleaning Composition | Water Wt. % | 1,2-dihydroxybenzene Wt. % |
|---|---|---|
| A | 25% | 0% |
| B | 20% | 0% |
| C | 20% | 5% |
| D | 17.5% | 15% |
| E | 63.5% | 2.5% |
| F | 20% | 5% |
| G | 15% | 0% |

EXAMPLE 1

Figure 2:
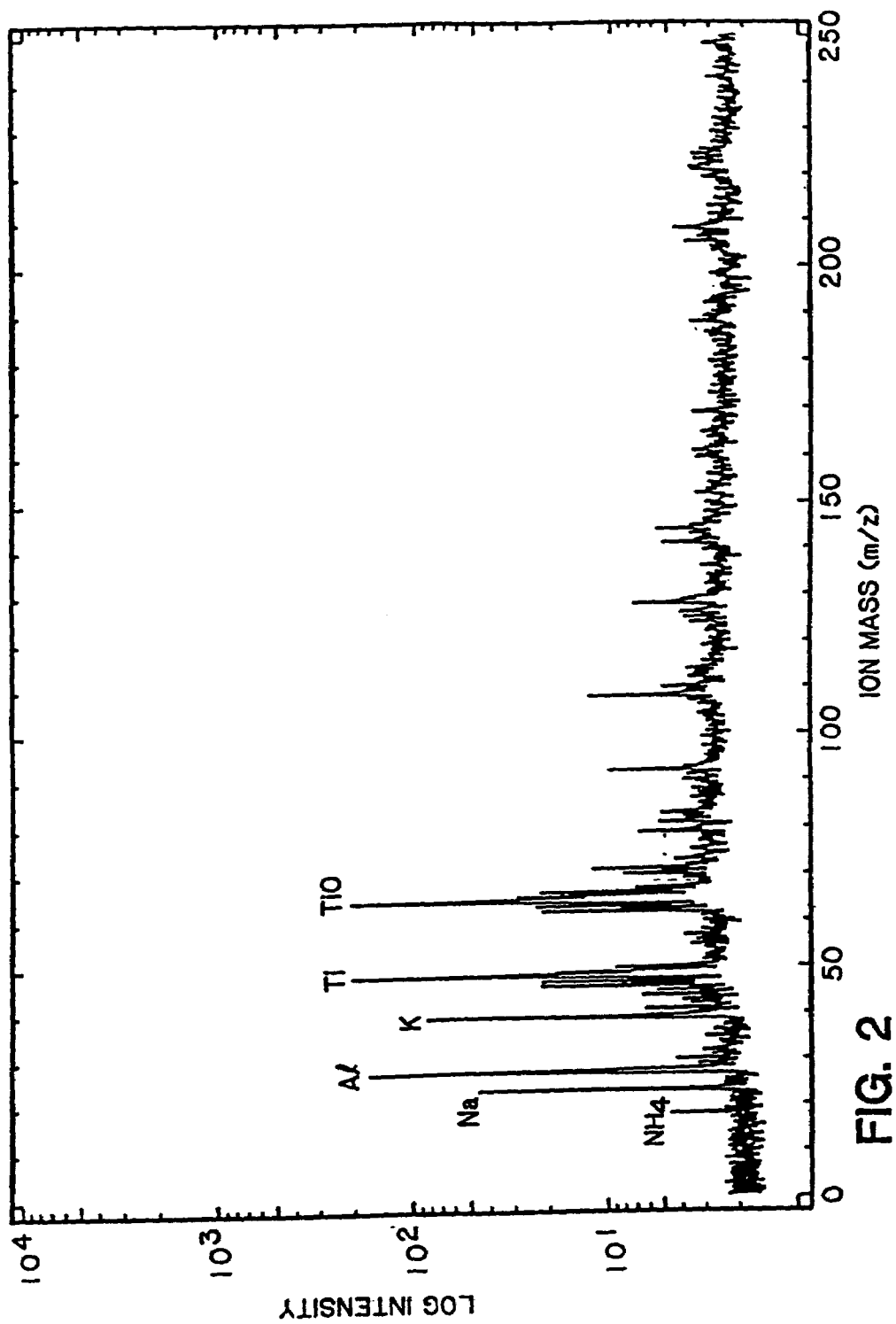
FIG. 2 shows the results of an analysis using ion mass spectrometry (LIMA) of the residue shown in FIG. 1. Such analysis indicates that the residue contains metal oxide and trace amounts of organic material.

Example 1 illustrates the problem of residue remaining on a wafer substrate following plasma etching and ashing. FIG. 1 shows etched wafer residue present on an etched substrate following plasma ashing. Specifically, silicon oxide used as a dielectric layer has a pattern etched for a multi-layer interconnect according to a standard plasma etching process. A photoresist which was used as a masking material has already been removed by oxygen plasma ashing. Analysis of the residue present on the etched wafer was analyzed by ion mass spectrometry (LIMA). The results of the analysis are as shown in FIG. 2. The analysis confirms that the residue contains metal oxide and trace amounts of organic material.

EXAMPLE 2

Example 2 illustrates the effect of the cleaning composition of the present invention on a wafer as determined by C/V testing. C/V shift measurement is a means utilized to determine the effect of a chemical used to clean a wafer. A high voltage shift is mainly caused by mobile ion contamination to the wafer. Such contamination will adversely affect subsequent process steps and may eventually cause failure of the microcircuits.

The test evaluation compares the C/V shift of different conventional photoresist stripping compositions to the cleaning composition of the present invention. All wafers used were known to be good silicon oxide substrates. All chemicals were heated on a hot plate to the manufacturers' suggested operating temperature using a pyrex beaker. Each of the beakers utilized was new and had not been previously used in any chemical processing. Individual beakers were used for each product. After immersing the silicon oxide wafer in the described composition, the wafers were rinsed and dried. Table II sets forth the operating conditions and the results of the C/V shift test.

TABLE II

| Composition Product | Manufacturer | U.S. Pat. No. | Process Conditions | Results |
|---|---|---|---|---|
| PRS-3000 | J. T. Baker | 4,403,029 | 90° C./20 min. | +15.624 volts |
| EMT 300 | EMT | 4,770,713 | 90° C./20 min. | +2.440 volts |
| N-Methyl-2-Pyrrolidone | J. T. Baker | 4,395,479 | 90° C./20 min. | +2.044 volts |
| Nophenol 944 | EKC | 4,395,384 | 100° C./20 min. | −0.368 volts |
| Composition C | — | — | 65° C./20 min. | +0.221 volts |
| Control | — | — | — | −0.576 volts |

A negative reading means no change in C/V shift. The cleaning Composition C according to the present invention as described above was shown to provide a cleaner surface than any of the positive photoresist strippers tested.

EXAMPLE 3

Figure 3A:
FIGS. 3A and 3B show the results of a comparison test utilizing a cleaning composition of the present invention (FIG. 3A) and a stripping composition as described in U.S. Pat. No. 4,403,029 (FIG. 3B) in relation to a silicon oxide dielectric layer containing etching residue thereon which is present following removal of a resist by plasma ashing. By comparing FIG. 3A with FIG. 3B, it can be seen that all the organometallic residue was removed using the composition of the present invention while residue remained following use of the stripping composition described in U.S. Pat. No. 4,403,029.
Figure 3B:
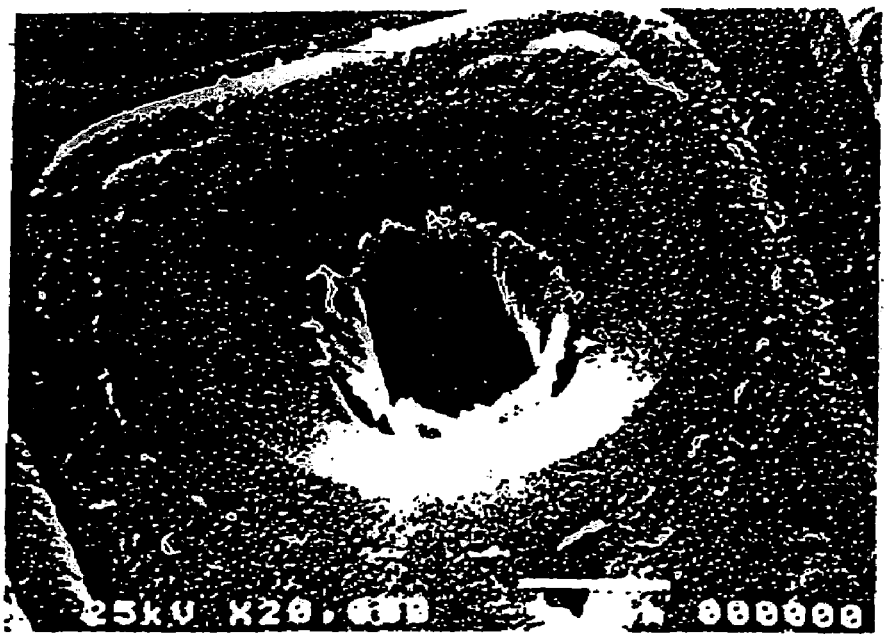

Example 3 illustrates the results of a comparison test between Composition F of the present invention as described above and the stripping composition described in U.S. Pat. No. 4,403,029 and sold under the name PRS-2000 by J. T. Baker. The results of the comparison test are shown with respect to an opening having the site of 1.2 micron in FIGS. 3A and 3B. Each opening was present on a silicon oxide dielectric layer which was etched using a standard silicon oxide plasma etching process. The photoresist was removed from the layer following etching by oxygen plasma ashing. The substrate was then processed by immersing the substrate in Composition F as described above for 10 minutes at 65° C. A micrograph from a scanning microscope as shown in FIG. 3A indicates that Composition F removed all the organometallic residue. As shown in FIG. 3B, residue remained on the substrate when an etched wafer prepared under the same process conditions was processed by immersion in PRS-2000 for 10 minutes at 65° C.

EXAMPLE 4

Example 4 illustrates the results of a comparison test between Composition C as described above and a stripping composition as described in U.S. Pat. No. 4,770,713 and sold under the name ACT-150I. ACT-150I is a dimethylacetamide solvent based photoresist stripper.

Figure 4A:
FIGS. 4A and 4B show the results of a comparison test utilizing a cleaning composition of the present invention (FIG. 4A) and a stripping composition as described in U.S. Pat. No. 4,770,713 (FIG. 4B) in relation to a silicon dielectric layer which contained etching residue following removal of a resist therefrom by plasma ashing. As evident upon a comparison of FIG. 4A with FIG. 4B, the composition of the present invention removed all the organometallic residue while the other composition did not.
Figure 4B:
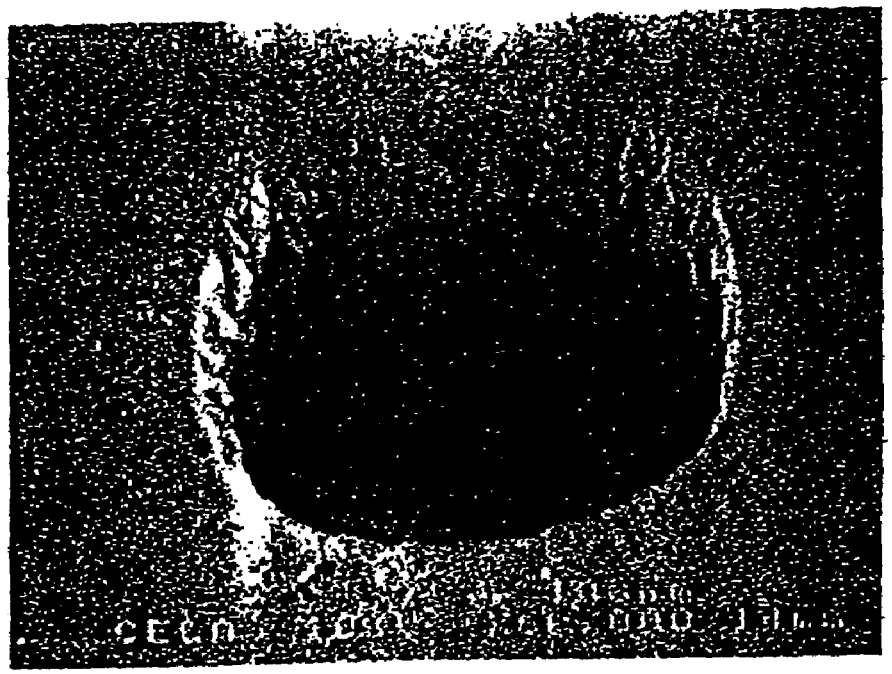

The comparison test results are shown in FIGS. 4A AND 4B with respect to openings having a size of 1.0 micron. Each opening was present on a silicon oxide dielectric layer which was etched using a standard silicon oxide plasma etching process. The photoresist was removed by oxygen plasma ashing. The substrate was then processed by immersion in Composition C as described above for 30 minutes at 45° C. A micrograph from a scanning electron microscope as shown in FIG. 4A shows that Composition C completely removed all the organometallic residue without damaging the silicon oxide substrate. FIG. 4B shows a substrate prepared under the same process conditions after immersion in ACT-150I for 30 minutes at 45° C. As shown in FIG. 4B, the stripping composition only partially removed the etching residue.

EXAMPLE 5

Figure 5A:
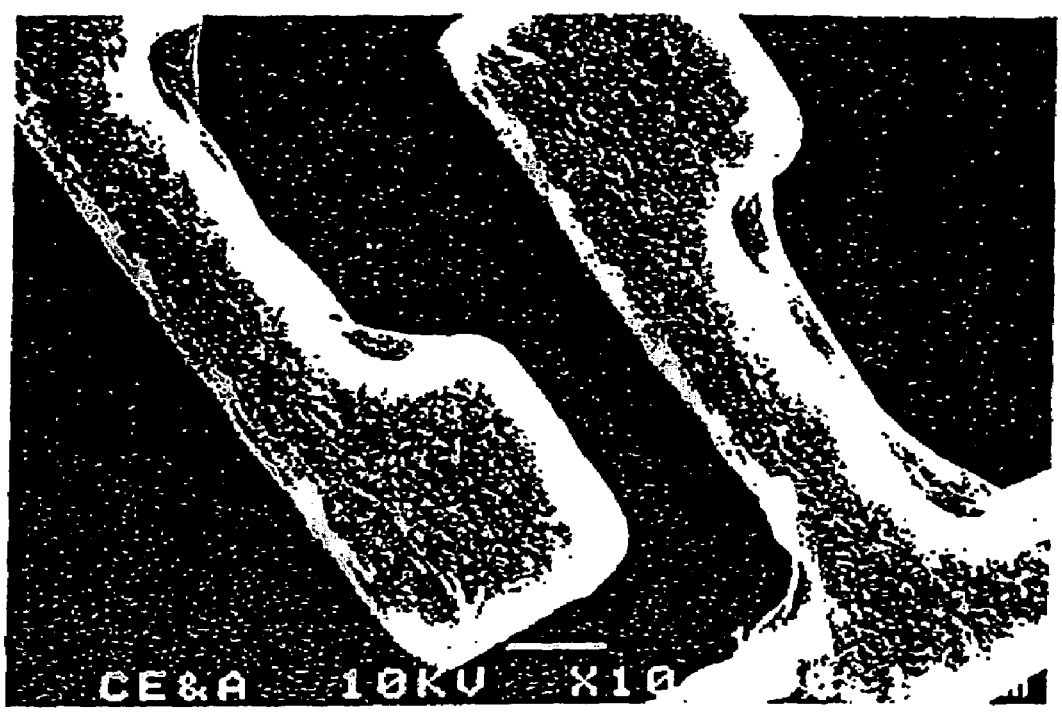
FIG. 5A shows a microcircuit pattern of polysilicon over silicon oxide containing etching residue which remained on the substrate following plasma etching.
Figure 5B:
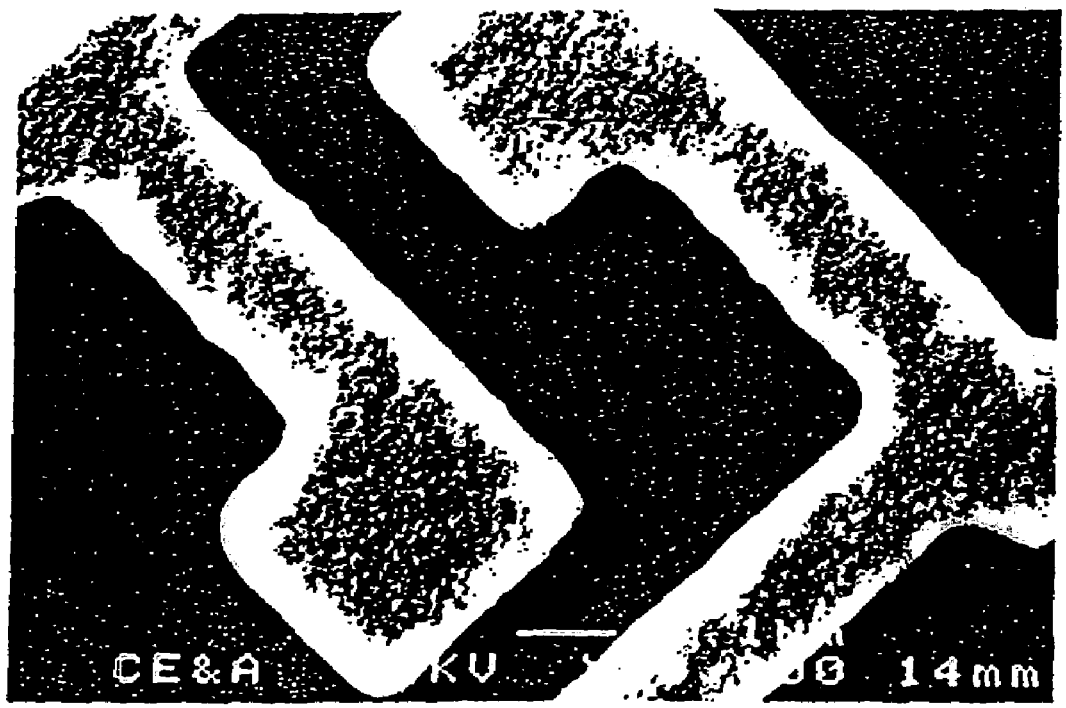
FIG. 5B shows the same microcircuit pattern following cleaning with a composition of the present invention. As evident from a comparison of FIG. 5A with FIG. 5B, it can be seen that the residue has been removed.

Example 5 illustrates the cleaning of polysilicon etching residue. A microcircuit pattern of polysilicon over silicon oxide was etched in plasma etching equipment using HBr as an etching gas. The photoresist was removed by oxygen plasma ashing. The etching residue, which is mostly Si—C—Br, is shown in FIG. 5A to remain on the polysilicon circuit line following the removal of the photoresist. When the wafer was further processed by immersion in Composition C of the present invention at 65° C. for 20 minutes, all of the etching residue was removed from the substrate as shown in FIG. 5B.

EXAMPLE 6

Figure 6A:
FIG. 6A shows residue which remained on a metal substrate after the removal of a photoresist from the substrate by plasma ashing.
Figure 6B:
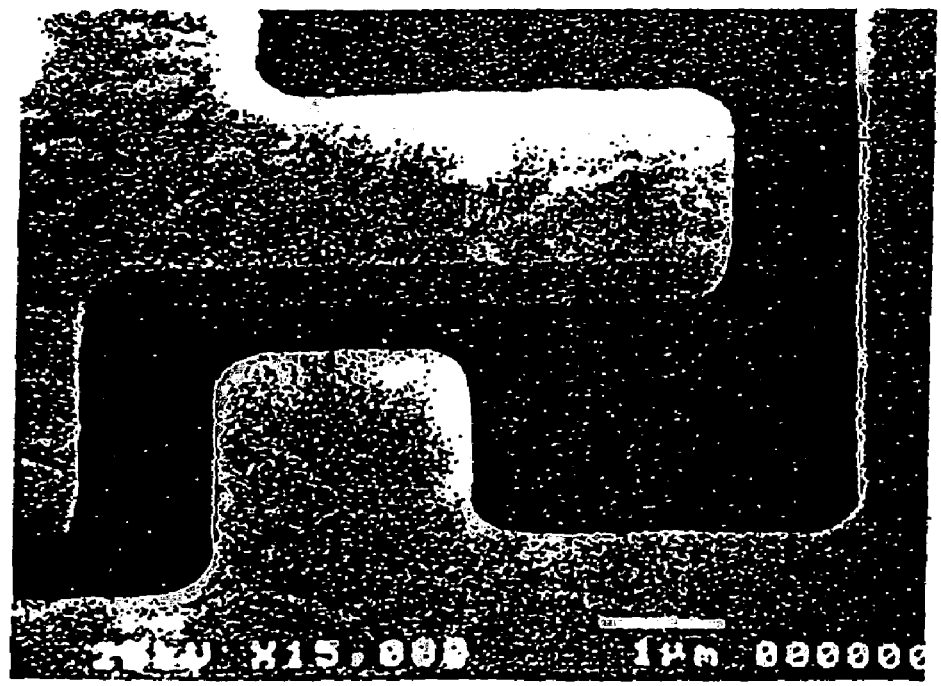
FIG. 6B shows the same substrate following cleaning with a composition of the present invention.

Example 6 illustrates the cleaning of a metal etch residue from a substrate. A sandwich metal substrate of TiW/Al—Si—Cu/TiW was patterned and etched in a plasma metal etcher, i.e., Applied Material 8330 Metal Etcher. This metal etcher is a batch etching equipment and therefore is capable of treating more than one wafer at a time. Due to the manner of etching performed by such etching equipment, a lesser amount of "polymer" residue is built-up during etching. As shown in FIG. 6A, residue remained on the metal line after the photoresist was removed by oxygen plasma ashing. The wafer was then processed by immersion in Composition B as described above at 65° C. for 30 minutes. As shown in FIG. 6B, Composition B served to remove all the organometallic residue from the surface.

EXAMPLE 7

Figure 7A:
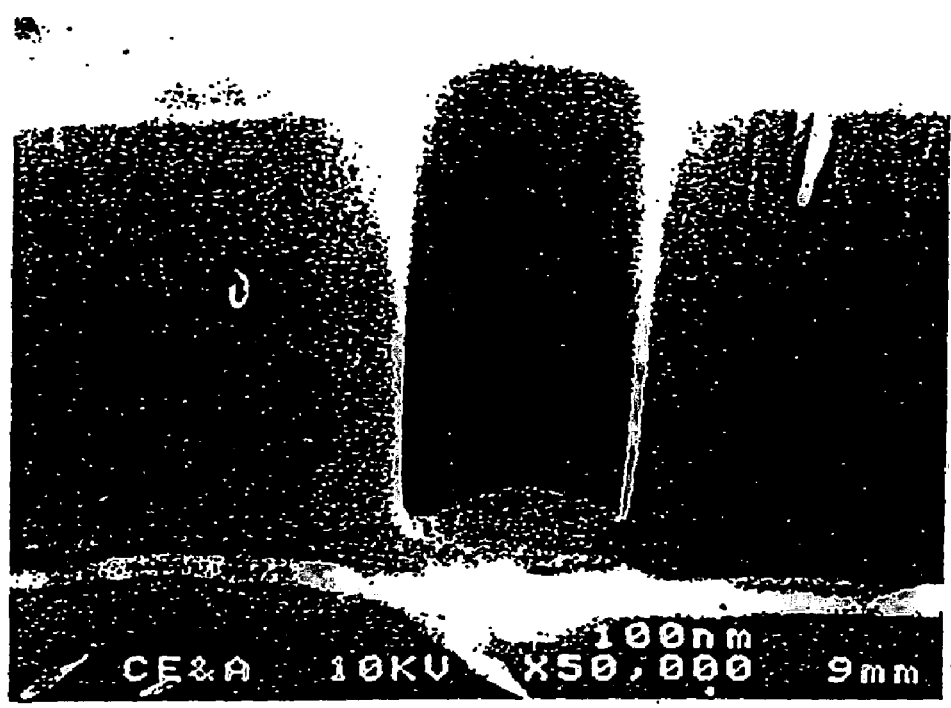
FIGS. 7A-7D show the results of comparison tests using a cleaning composition of the present invention (FIGS. 7A and 7B) and a N-methyl-2-pyrrolidone solvent/-alkanolamine base stripper (FIGS. 7C and 7D) in relation to openings on a silicon oxide dielectric layer.
Figure 7B:
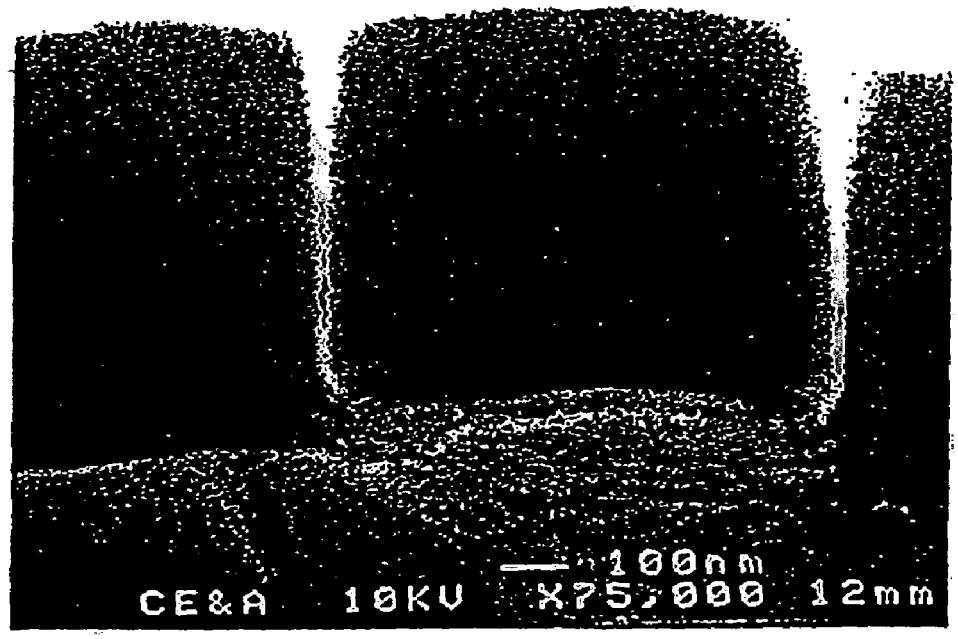
Figure 7C:
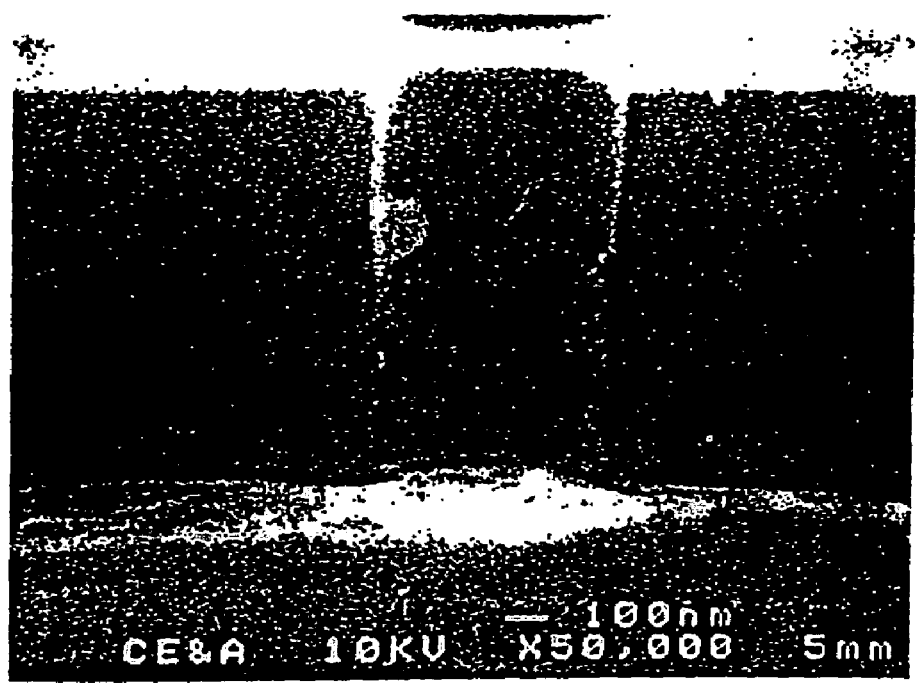
Figure 7D:
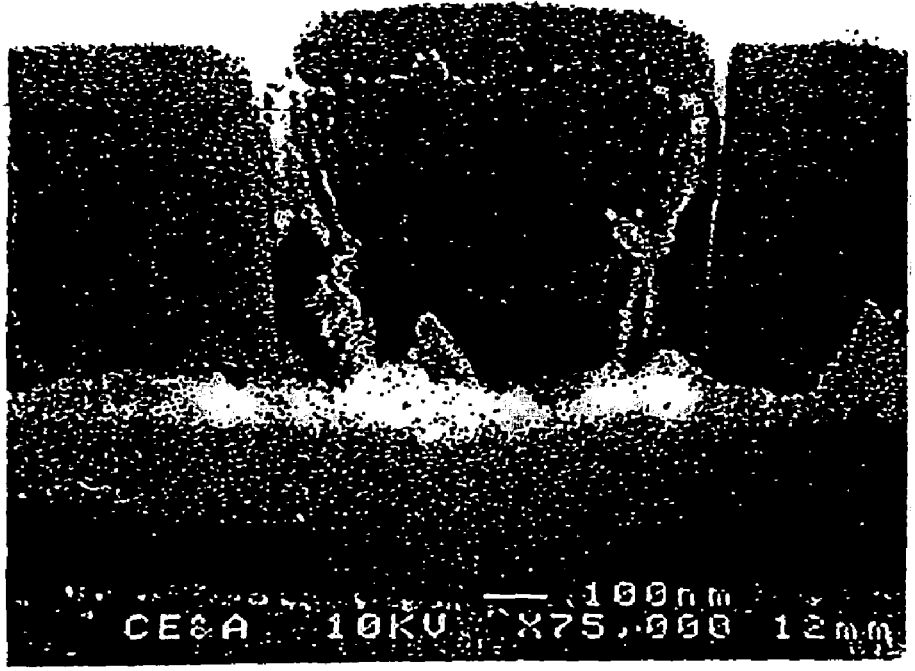

Example 7 illustrates the cleaning of a submicron circuit by means of via holes or openings, i.e., the holes on openings in the dielectric covering layer on a substrate which allow access to conductive material on the substrate, having a size of 0.6 microns on a silicon oxide dielectric layer which had been etched using a standard silicon oxide plasma etching processing. In particular, an oxide etcher as sold by Lam Research was utilized. In this process, the etching residue is mostly silicon containing polymer with a small ratio of metal in the composition. The underlying layer was a metal substrate of TiN/Al—Si—Cu. The photoresist masking material was removed by oxygen plasma ashing. The substrate was then processed by immersion in Composition A as described above for 30 minutes at 60° C. A cross-section micrograph from a scanning microscope as shown in FIG. 7A indicates that Composition A removed all the organometallic residue. As shown in FIG. 7B, however, residue remained inside the opening when an etched wafer processed in the same conditions was treated in N-methyl-2-pyrrolidone solvent/alkanolamine based stripper for 60 minutes at 90° C. in an ultrasonic bath.

EXAMPLE 8

Portions of silicon oxide etching equipment which are made of heavy gauge aluminum were removed from the etching equipment for cleaning. The conventional procedure utilized to remove the deposited outgas residue on the etching equipment is by sandblasting. Sandblasting, however, is a time consuming procedure. It has been found that the residue deposited on the aluminum portion of the etching equipment can be easily removed by immersion in a composition of the present invention. An aluminum portion of etching equipment was immersed in Composition E for 30 minutes at 40° C. Following rinsing and drying, it was observed that the residue was removed.

EXAMPLE 9

The conventional process of cleaning a ceramic ring which forms a part of metal etching equipment involves either sandblasting or scrubbing by hand. Composition A was utilized to clean such ceramic ring by immersing the ceramic ring in an ultrasonic bath for 45 minutes at 35° C. It was found that the deposits on the ceramic ring were completely removed.

EXAMPLE 10

Figure 8A:
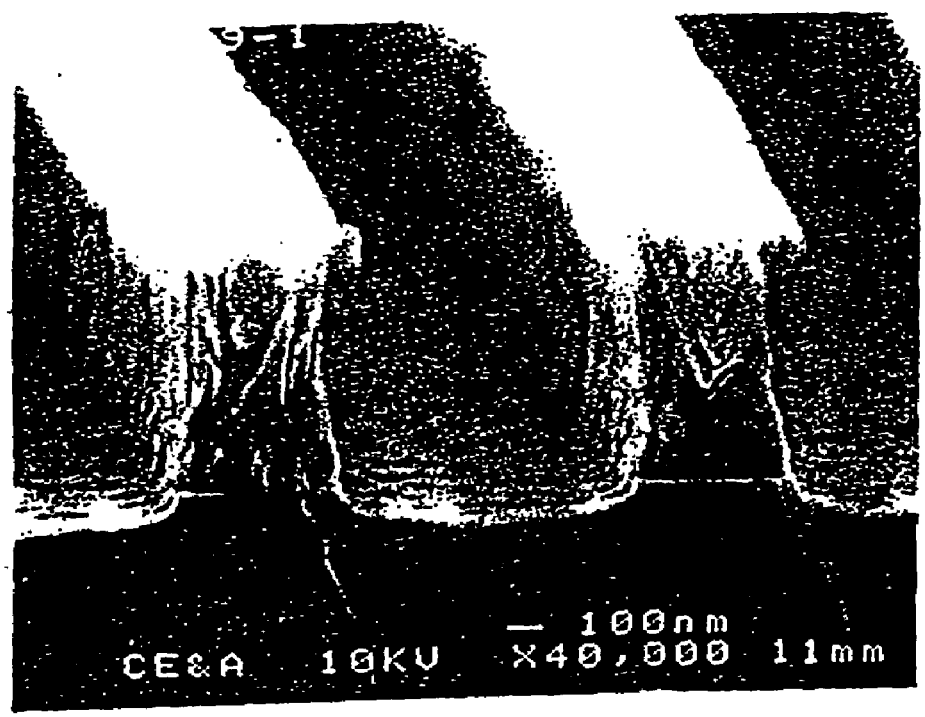
FIG. 8A shows residue remaining on a wafer following etching and the removal of a photoresist therefrom.
Figure 8B:
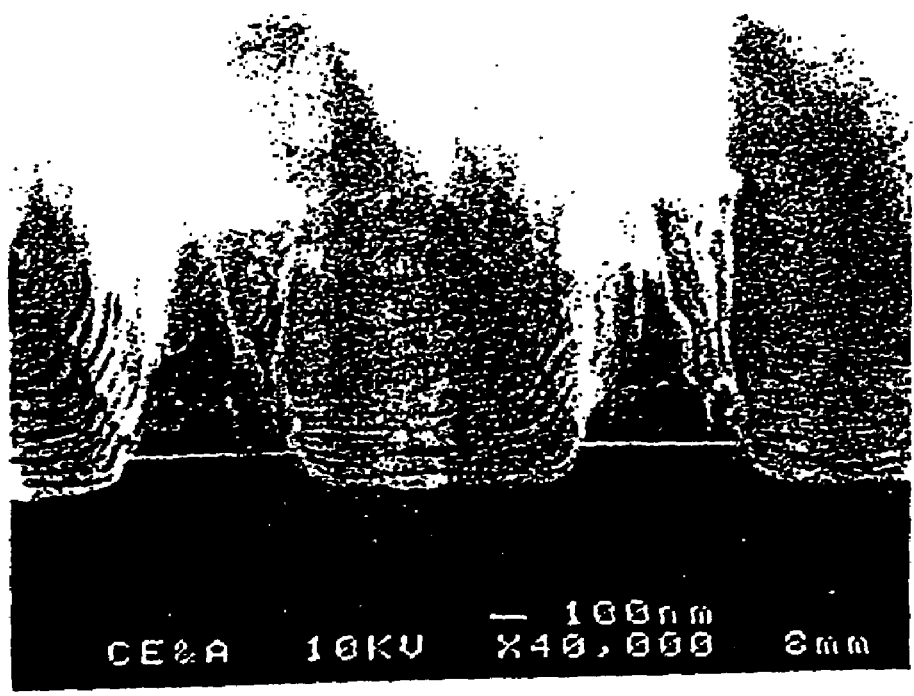
FIG. 8B shows the same wafer following cleaning with a composition of the present invention. All the residue on the wafer was removed.

Example 10 illustrates the cleaning of metal etch residue. An Al—Si—Cu/W/TiW metal pattern sitting on a plasma enhanced TEOS was utilized. The wafer had 50% overetching. P-5000 as sold by Applied Material was used for the metal etching. The P-5000 is a single wafer etcher and due to the processing technique of the etching equipment, a higher build-up of polymer remains following the etching which is more difficult to remove than that described in Examples 6 and 7 above. A sandwich metal substrate of Al—Si—Cu/W/TiW was patterned and etched in the plasma metal etcher P-5000. The small amount of residue left on the corner of the metal line after the photoresist was removed by oxygen plasma ashing and was cleaned using Composition B at 65° C. for 30 minutes. Such cleaned substrate is shown in FIG. 8A. Composition B did not provide for complete removal of the residue. A similar etched wafer was then processed by immersion in Composition D as described above at 65° C. for 30 minutes. As shown in FIG. 8B, Composition D removed all the organometallic residue from the surface. Composition B does not contain a chelating agent and Composition D contains a chelating agent. It is surmised that the activity of Composition B had begun to decrease due to its short term effectiveness based on the absence of a chelating agent.

EXAMPLE 11

Example 11 illustrates that cleaning solutions containing chelating agents have increased stability as compared to the cleaning solutions not containing chelating agents. Compositions A, C and G, as described in Table I, were each placed in separate sealed Pyrex flasks and maintained at room temperature for a period of 80 days. A sample was taken from each flask at regular intervals and analyzed to determine its activity. The activity of the cleaning compositions is measured by the reduction potential of the hydroxylamine.

Figure 9:
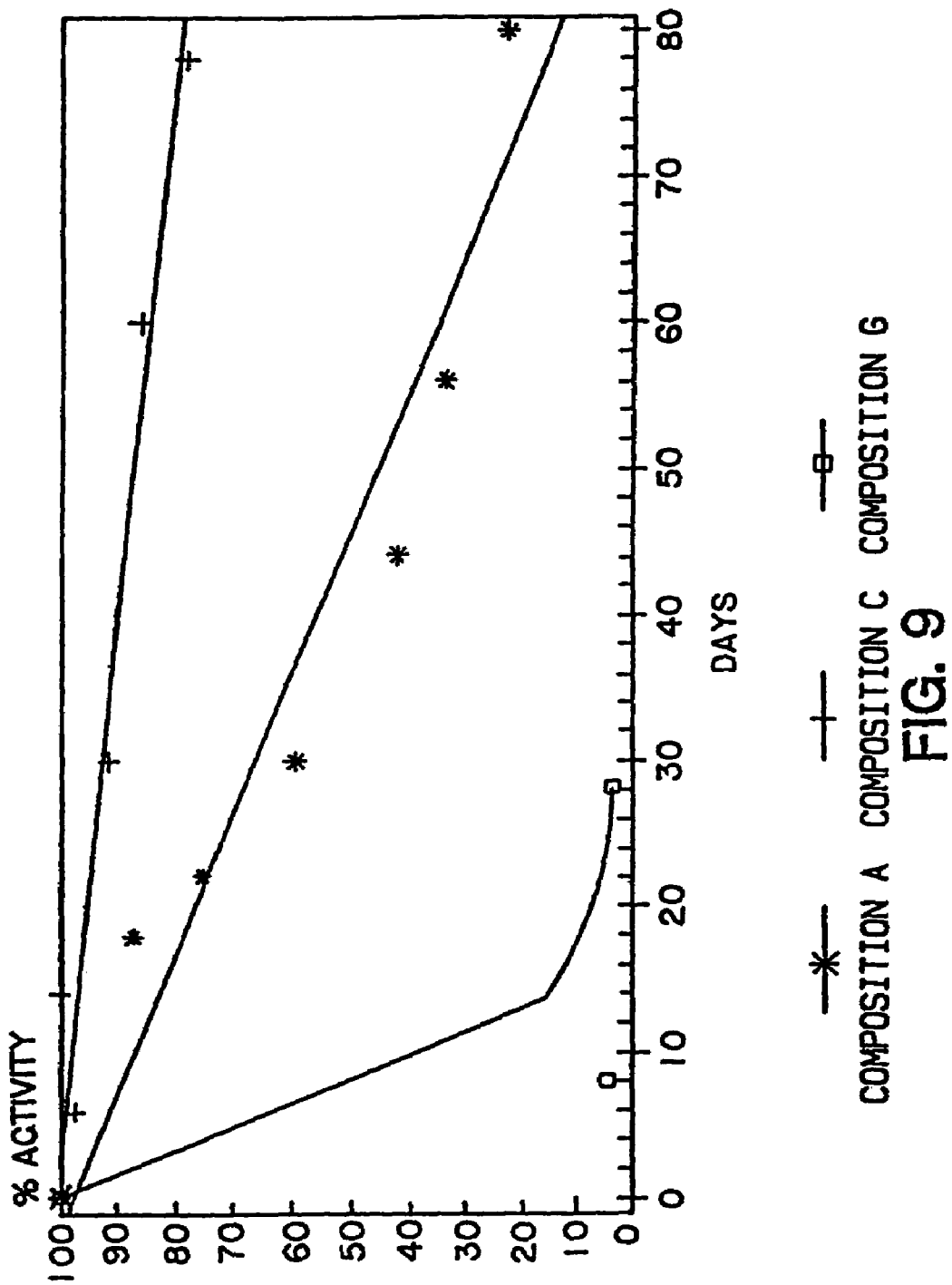
FIG. 9 illustrates the results of Example 11 below wherein the stability of cleaning Compositions A, C and G were compared.

It can be seen from FIG. 9 that Compositions G and A, which does not contain a chelating agent, lost their activity much faster than Composition C.

Examples 16-29 below are further illustrative of cleaning solutions prepared in accordance with the present invention. Examples 16-24 describe cleaning solutions having long term effectiveness due to the inclusion of catechol or dihydroxybenzene as a chelating agent. Examples 25-29 are illustrative of cleaning solutions which do not contain a chelating agent and therefore have short term effectiveness.

The procedure utilized with respect to Examples 16-29 involved mixing the composition components together followed by heating of the mixture to 65° C. Wafer samples were then immersed in the cleaning solution for 30 minutes with infrequent agitation. The wafer samples were then placed in a N-methyl-2-pyrrolidinone bath having a temperature of 80-85° C. for 10 minutes. Thereafter, the wafer samples were rinsed in a water bath. In some of the Examples, the cleaning solution was subsequently diluted by the addition of 20 parts water and fresh wafer samples processed therein utilizing the same procedure for comparative purposes. The dried wafers were evaluated by an SEM spectrometer.

As used in the Examples, "DGA" stands for diglycolamine which is also known as 2-amino-2-ethoxy ethanol, "DMSO" stands for dimethylsulfoxide and catechol is 1,2-dihydroxybenzene.

EXAMPLE 16

A cleaning solution including 35 parts hydroxylamine (50% aqueous), 27 parts DGA, 5 parts catechol and 33 parts DMSO was prepared and utilized to clean a wafer. The wafer had a polysilicon structure and was completely cleaned with no damage to the structure by the cleaning solution. Wafers containing via holes also were cleaned of plasma etching residue.

The cleaning solution was thereafter diluted with 20 parts water and fresh wafer samples cleaned utilizing the solution. The additional water did not reduce the ability of the solution to clean polysilicon structures. The etching residue was satisfactorily removed from the wafer samples.

EXAMPLE 17

A cleaning solution containing 34 parts hydroxylamine (50% aqueous), 5 parts catechol, 54 parts N-methyl-2-pyrrolidinone and 7 parts tetramethylammonium hydroxide (25% aqueous) was prepared and utilized to clean wafers having a metal structure. The wafers were cleaned of etching residue leaving no evidence of corrosion.

Thereafter, the cleaning solution was diluted with 20 parts water. Via holes in the wafers were cleaned with the diluted solution leaving no evidence of undercutting the substrate.

EXAMPLE 18

A cleaning solution was prepared containing 35 parts hydroxylamine (50% aqueous), 59 parts DGA, 5 parts t-butylcatechol and 1 part water. The solution was utilized to clean wafers having a polysilicon structure. The wafers were cleaned without pitting of the substrate.

Thereafter, 20 parts water was added to the cleaning solution. The diluted solution was utilized to clean fresh wafer samples. The dilution of the cleaning solution did not diminish the cleaning effect of the solution on polysilicon structures. Each of the solutions of Example 18 were satisfactorily effective on via holes with no evidence of undercutting of the wafer substrate.

EXAMPLE 19

A cleaning solution was prepared containing 35 parts hydroxylamine (50% aqueous), 45 parts DGA, 5 parts catechol and 15 parts tetramethylammonium hydroxide (25% aqueous). The cleaning solution provided good cleaning of polysilicon structures with no pitting of the substrate.

EXAMPLE 20

A cleaning solution was prepared containing 60 parts DGA, 5 parts catechol and 35 parts N,O-dimethyl-hydroxylamine (50% aqueous). The cleaning solution provided good cleaning of polysilicon structures and showed very satisfactory results in the cleaning of via holes.

Thereafter, the cleaning solution was diluted with 20 parts water and utilized to clean fresh wafers. Dilution of the cleaning solution did not diminish the cleaning ability of the solution.

EXAMPLE 21

A cleaning solution was prepared containing 51 parts DGA, 5 parts catechol, 31 parts methoxylamine hydrochloride and 13 parts water. The cleaning solution cleaned metal structures leaving no corrosion on the structures.

Subsequently, when 20 parts water was added to the cleaning solution to dilute the solution, the diluted solution was found to clean polysilicon and via hole features with no apparent corrosion of the metal structure.

EXAMPLE 22

A cleaning solution containing 60 parts DGA, 5 parts catechol and 35 parts N,N-diethylhydroxylamine was prepared. The cleaning solution cleaned metal structures with no apparent corrosion of the structures.

When the cleaning solution was diluted with 20 parts water, the solution adequately cleaned via holes and metal structures.

EXAMPLE 23

A cleaning solution was prepared containing 61 parts DGA, 5 parts catechol and 34 parts acetohydroxamic acid. The cleaning solution provided acceptable polysilicon wafer cleaning.

Subsequent dilution of the cleaning solution with 20 parts water did not affect the ability of the solution to clean via hole structures in wafers.

EXAMPLE 24

A cleaning solution was prepared containing 60 parts DGA, 5 parts catechol, and 35 parts methylhydrazine. The cleaning solution provided good results in cleaning wafer via holes.

Subsequent dilution of the cleaning solution with 20 parts water did not significantly diminish the solution's ability to clean via holes having plasma etch residues thereon.

EXAMPLE 25

A cleaning solution containing 49 parts DGA, 4 parts catechol, 29 parts methylhydrazinocarboxylate, and 18 parts water was prepared. The cleaning solution was effective for cleaning polysilicon and via hole structures.

EXAMPLE 26

A cleaning solution having short term effectiveness was prepared containing 35 parts hydroxylamine (50% aqueous), 60 parts DGA and 5 parts dimethylgloxime. The cleaning solution, when used just subsequent to its preparation, provided acceptable results for cleaning via holes.

When 18 parts water was subsequently added to the cleaning solution, via holes were still effectively cleaned of plasma etch residue by the diluted solution.

EXAMPLE 27

A cleaning solution containing 60 parts DGA and 40 parts N,O-dinethylhydroxylamine (50% aqueous) was prepared. When utilized immediately following preparation of the solution, the cleaning solution cleaned polysilicon structures with no problem.

EXAMPLE 28

A cleaning solution containing 53 parts DGA, 33 parts N-methylhydroxylamine hydrochloride and 14 parts water was prepared. The cleaning solution, when used immediately following preparation of the solution, cleaned polysilicon structures and via holes with no detrimental effect.

EXAMPLE 29

A cleaning solution was prepared containing 60 parts DGA and 40 parts N,N-diethylhydroxylamine and 20 parts water. The cleaning solution cleaned polysilicon structures with no corrosion resulting when the solution was utilized immediately following its preparation.

EXAMPLE 30

A cleaning solution was prepared containing 60 parts DGA, and 40 parts hydroxylamine (50% aqueous). The cleaning solution adequately cleaned polysilicon structures, via holes and metal structures. However, after approximately one week, the solution lost its effectiveness although the composition had not changed. Five parts catechol were then added to the solution and the solution reactivated. The reactivated solution was able to again clean wafer structures, including via holes.

Upon diluting the reactivated cleaning solution with 18 parts water, the cleaning ability of the solution was found to be undiminished.

From the various test results set forth in the Examples, it can be seen that the cleaning solutions of the present invention provide novel and surprising results. The composition allows for a simple method of use and is adaptable to various modifications while still providing the desired results. The composition of the invention therefore allows for broad application upon minor adjustments.

As will be apparent to one skilled in the art, various modifications can be made within the scope of the aforesaid description. Such modifications being within the ability of one skilled in the art form a part of the present invention and are embraced by the appended claims.

We claim:

1. A method for replenishing a resist and etching residue removal composition comprising adding a chelating agent to said composition after said composition has been used to remove resist and etching residue from a semiconductor substrate, wherein said composition comprises:

hydroxylamine or a derivative thereof having a general formula of:

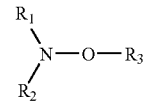

wherein $R_1$, $R_2$, and $R_3$ are independently hydrogen; a $C_1$-$C_6$ straight, branched or cyclo alkyl, alkenyl, or alkynyl group; an acyl group; a straight or branched alkoxy group, amidyl group, carboxyl group, alkoxyalkyl group, alkylamino group, alkylsulfonyl group, or sulfonic acid group; or a salt thereof, at least one organic solvent and water.

2. The method of claim 1, further comprising rinsing said semiconductor substrate with a rinse comprising water after removing said resist and etching residue from said semiconductor substrate.

3. The method of claim 1, wherein the composition comprises at least one organic solvent which is miscible with the hydroxylamine or a derivative thereof.

4. The method of claim 1, wherein the composition is reactivated with the chelating agent, wherein the chelating agent is added at an amount of 5 parts by weight to an existing 100 parts by weight of the composition.

5. The method of claim 1, wherein the hydroxylamine or derivative thereof comprises hydroxylamine.

6. The method of claim 4, wherein the chelating agent added for replenishment is catechol and further adding water to said composition after said composition has been used to remove resist and etching residue, wherein the water is added at an amount of 18 parts by weight to an existing 5 parts by weight of said chelating agent and an existing 100 parts by weight of the composition.

7. The method of claim 1, wherein the resist and etching residue removal composition comprises:
  (1) from about 5% to about 50% by weight of hydroxylamine;
  (2) from 10 to about 80% by weight of one or more organic solvents;
  (3) water;
  (4) from about 5% to 30% by weight of chelating agent(s) comprising at least one of:
    (i) one or more hydroxy-functional compounds of formula II:

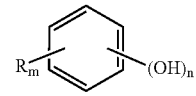

wherein n=1-4, m=2-5, and each R is independently hydrogen; a $C_1$-$C_6$ straight, branched or cyclo alkyl, alkenyl, or alkynyl group; an acyl group; a straight or branched alkoxy group, amidyl group, carboxyl group, alkoxyalkyl group, alkylamino group, alkylsulfonyl group, or sulfonic acid group; or a salt thereof;

(ii) thiophenol, a derivative thereof, or mixtures thereof, each of formula III:

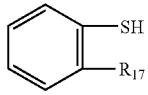

wherein $R_{17}$ is OH or COOH;

(iii) an ethylene diamine tetracarboxylic acid, a derivative thereof, or mixtures thereof, each of formula IV:

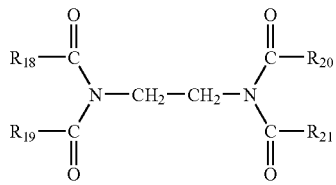

wherein $R_{18}$, $R_{19}$, $R_{20}$ and $R_{21}$ can individually be H or $NH_4$; and (iv) one or more alkylammonium hydroxides of the formula V, $(R_{11} R_{12} R_{13} R_{14})NOH$, wherein $R_{11}$, $R_{12}$, $R_{13}$, and $R_{14}$ are the same or different and comprise alkyl groups having from 1 to 5 carbon atoms.

8. The method of claim 7, further adding 18 percent by weight water, based on the total weight of said resist and etching residue removal composition, to said composition after said composition has been used to remove resist and etching residue.

9. The method of claim 7, wherein the composition is reactivated with 5 percent by weight of the chelating agent, based on the total weight of said resist and etching residue removal composition.

10. The method of claim 7, wherein the chelating agent added for replenishment is catechol.

11. The method of claim 9, wherein the chelating agent added for replenishment is catechol and further adding 18 percent by weight water, based on the total weight of said resist and etching residue removal composition, to said composition after said composition has been used to remove resist and etching residue.

* * * * *